(12) United States Patent
Belknap et al.

(10) Patent No.: US 11,533,827 B2
(45) Date of Patent: Dec. 20, 2022

(54) ADHESIVE LAYERED BACKFLOW PREVENTER

(71) Applicant: Western Digital Technologies, Inc., San Jose, CA (US)

(72) Inventors: Carson Belknap, Colorado Springs, CO (US); Jeff Wilke, Palmer Lake, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 3 days.

(21) Appl. No.: 17/174,281

(22) Filed: Feb. 11, 2021

(65) Prior Publication Data
US 2022/0061189 A1 Feb. 24, 2022

Related U.S. Application Data

(60) Provisional application No. 63/067,146, filed on Aug. 18, 2020.

(51) Int. Cl.
*H05K 7/20* (2006.01)

(52) U.S. Cl.
CPC .............. *H05K 7/20727* (2013.01)

(58) Field of Classification Search
None
See application file for complete search history.

(56) References Cited

U.S. PATENT DOCUMENTS

| 5,355,910 | A | * | 10/1994 | Gies | F16K 15/144 |
| | | | | | 454/162 |
| 5,890,959 | A | * | 4/1999 | Pettit | H05K 7/2019 |
| | | | | | 137/849 |
| 9,137,930 | B2 | | 9/2015 | Alshinnawi et al. | |
| 2006/0016482 | A1 | | 1/2006 | Berens et al. | |
| 2008/0310103 | A1 | | 12/2008 | Della Fiora et al. | |
| 2011/0175007 | A1 | | 7/2011 | Sato et al. | |
| 2012/0145257 | A1 | | 6/2012 | Li | |
| 2016/0327062 | A1 | | 11/2016 | Amin-Shahidi | |
| 2017/0218978 | A1 | | 8/2017 | Amin-Shahidi | |

(Continued)

FOREIGN PATENT DOCUMENTS

| CN | 202348782 U | 7/2012 |
| CN | 103133418 B | 11/2015 |

OTHER PUBLICATIONS

Israel Patent Office (ISA/IL), PCT International Search Report and Written Opinion for counterpart International application No. PCT/US2021/037703, dated Oct. 3, 2021, 9 pages.

(Continued)

*Primary Examiner* — Mukundbhai G Patel
(74) *Attorney, Agent, or Firm* — John D. Henkhaus (57) ABSTRACT

An adhesive layered backflow preventer laminate, for use in impeding airflow from flowing in a backflow direction through the backflow preventer and a corresponding cooling fan, includes a thin front support layer adhered to a thin backflow flap layer, having a plurality of backflow flaps, which is adhered to a thin rear support layer. Each of the structural layers is adhered to the adjacent structural layer using a respective double-sided adhesive layer, by way of a manufacturing process that avoids the use of costly injection molded parts and machined plastic parts and metal components such as springs and hinges.

20 Claims, 8 Drawing Sheets

(56) References Cited

U.S. PATENT DOCUMENTS

2018/0209446 A1\* 7/2018 Amin-Shahidi ...... F04D 29/541
2019/0047266 A1\* 2/2019 Blyth ....................... B32B 7/12

OTHER PUBLICATIONS

Vertiv Limited, Vertiv™ Knürr® It Special Catalog Networks & Data Centers, May 2019, 304 pages, Vertiv.com, Great Britain, downloaded from https://www.vertiv.com/globalassets/shared/vertiv-knurr--it-special-catalogue_ct_uk_emea.pdf.

\* cited by examiner

ADHESIVE LAYERED BACKFLOW PREVENTER

FIELD OF EMBODIMENTS

Embodiments of the invention may relate generally to data storage systems, and particularly to an adhesive layered backflow preventer for such a rack mounted system.

BACKGROUND

As networked computer systems grow in numbers and capability, there is a need for more storage system capacity. Cloud computing and large-scale data processing further increase the need for digital data storage systems that are capable of transferring and holding significant amounts of data. Data centers typically include many rack-mountable storage units that are used to store the large amounts of data.

One approach to providing sufficient data storage in data centers is the use of arrays of data storage devices. Many data storage devices can be housed in an electronics enclosure (sometimes referred to as a "rack"), which is typically a modular unit that can hold and operate independent data storage devices in an array, computer processors, routers and other electronic equipment. The data storage devices are mounted in close proximity to each other within the electronics enclosure, so that many data storage devices can fit into a defined volume. Operating many data storage devices within close proximity within the electronics enclosure can create heat issues, which can in turn lead to premature failure of the data storage devices.

Rack systems typically include fans or other cooling devices. Thus, with rack-mounted devices that utilize forced air convection for cooling, maintaining a continuous flow of air throughout the system is of utmost importance. A detrimental phenomenon experienced by such systems is that of backflow air loss, which is recirculation of air within the system rather than through the designated air channels. For example, if a fan fails in an electronics enclosure having two or more fans, the failed fan may become the pathway of least resistance for airflow and therefore may divert cooling airflow away from the data storage devices.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to managing airflow within an electronics enclosure, such as within a data storage system, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instance of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Rack-Mounted Data Storage System Context

Recall that with systems of rack-mounted devices that utilize forced air convection for cooling, a detrimental phenomenon experienced by such systems is that of backflow air loss or recirculation of air within the system rather than through the designated air channels. Hence, backflow preventers (also referred to as backflow stoppers) are at times employed to allow airflow to pass through in one direction while restricting airflow in the opposite direction, e.g., to substantially prevent backflow air loss through a cooling fan. However, often, relatively costly injection molded and/or machined plastic parts are used to fabricate a backflow preventer, which may further include metal components such as springs and/or hinges. Furthermore, depending on the material used the operational fan pressure may be compromised with previous designs in view of the mass of the hinged gates or flaps.

Figure 1A:
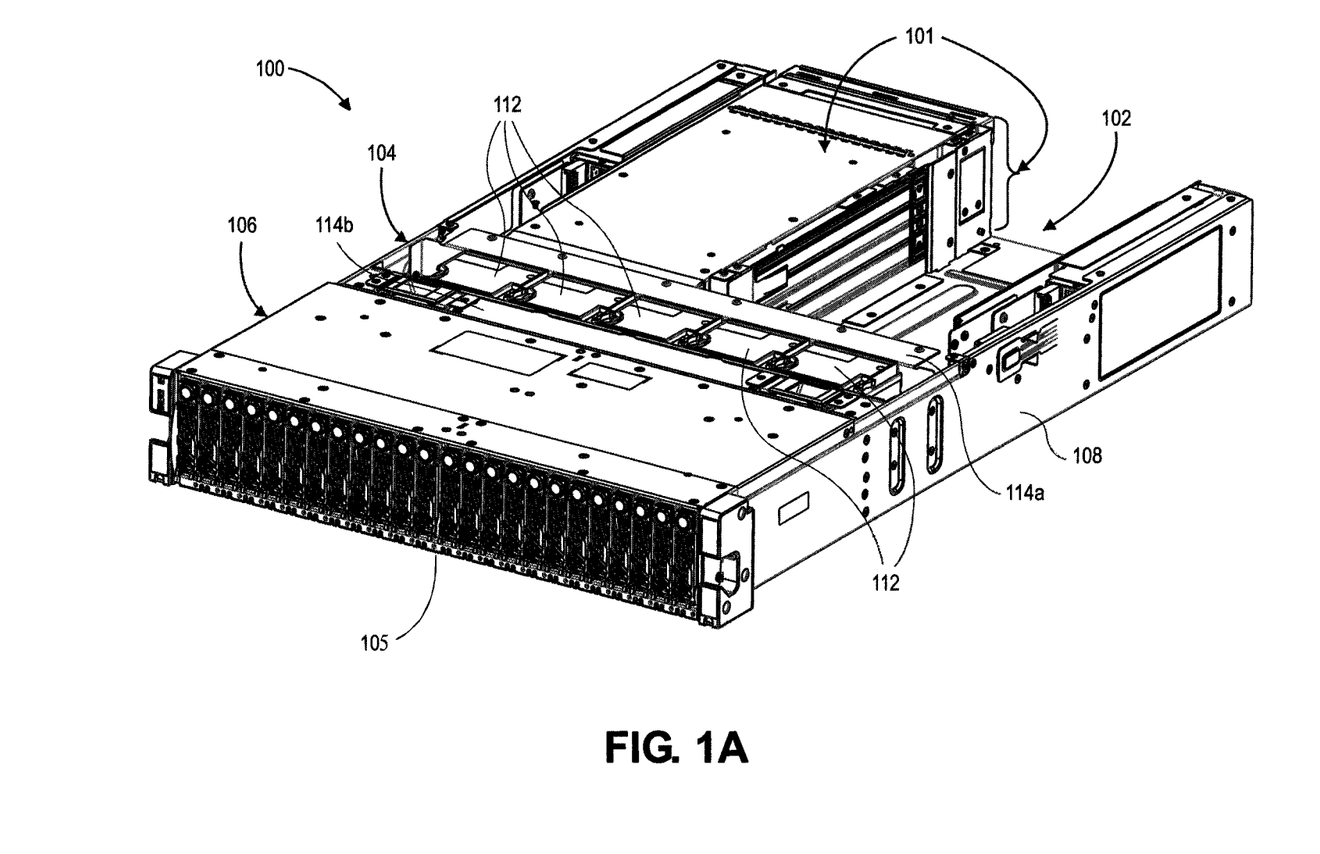
FIG. 1A is a perspective view illustrating a sled for a rack of a data storage system, according to an embodiment.
Figure 1B:
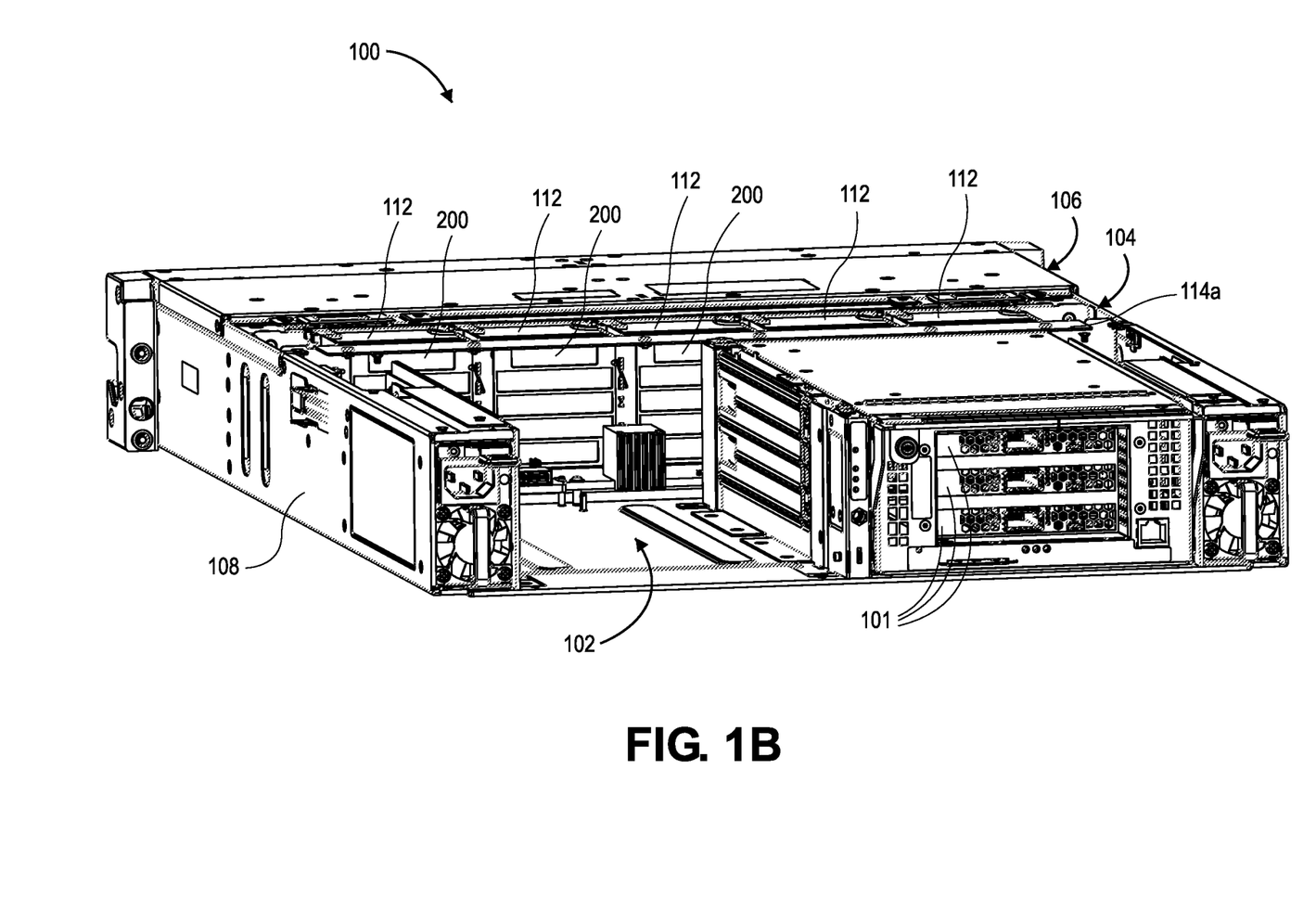
FIG. 1B is another perspective view illustrating the sled of FIG. 1A, according to an embodiment.
Figure 1C:
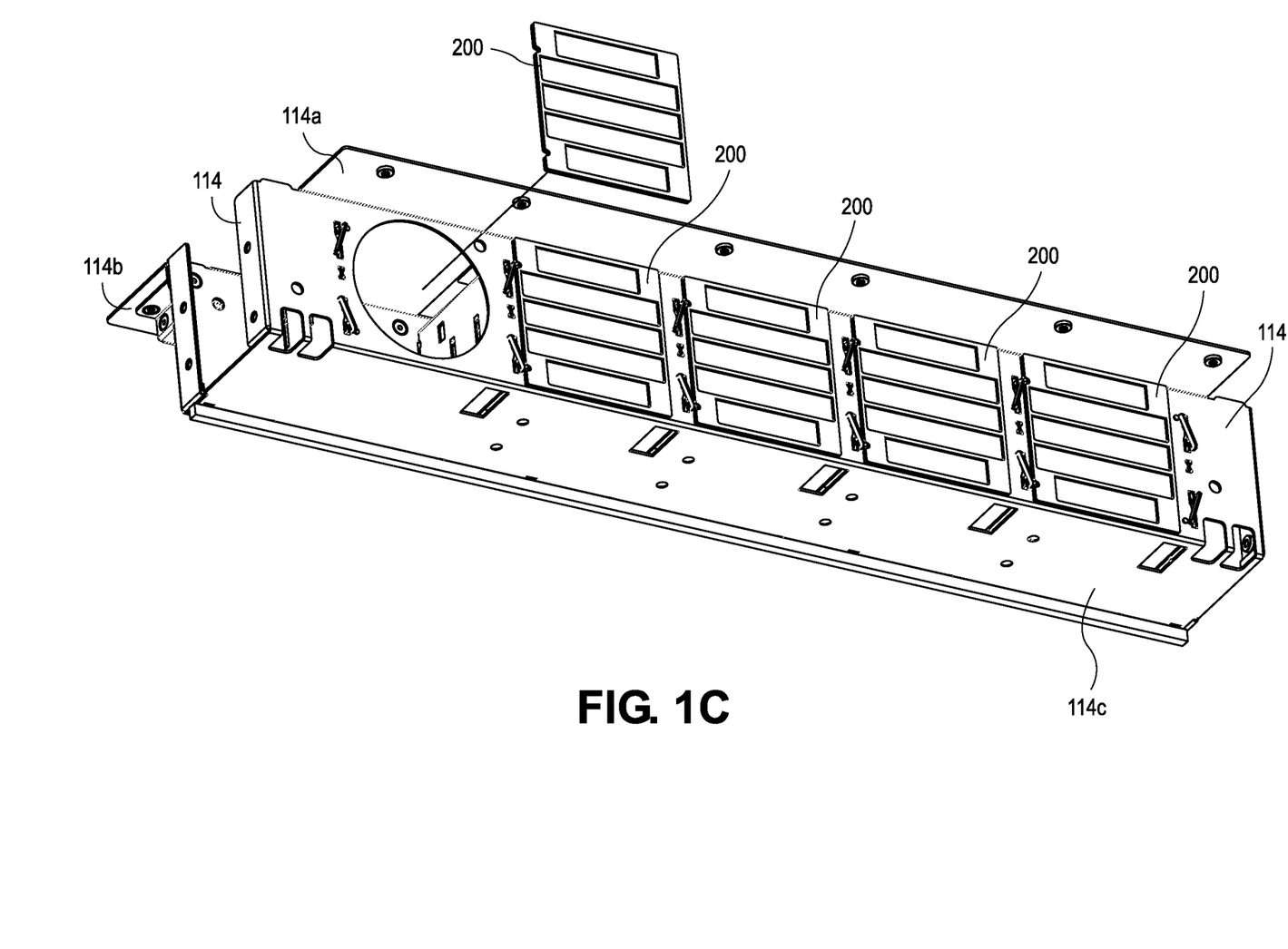
FIG. 1C is a perspective view illustrating a fan compartment of the sled of FIG. 1A, according to an embodiment.

FIG. 1A is a perspective view illustrating a sled for a rack of a data storage system, FIG. 1B is another perspective view illustrating the sled of FIG. 1A, and FIG. 1C is a perspective view illustrating a fan compartment of the sled of FIG. 1A, all according to an embodiment. An adhesive layered backflow preventer (or "backflow preventer laminate assembly") as described in more detail elsewhere herein may be implemented in the context of an electronics system and rack or system enclosure, generally, including a sled or shelf or system enclosure of a rack-mounted data storage system, particularly, such as illustrated in FIGS. 1A-1C. Such a backflow preventer is employed primarily for preventing or at least inhibiting backflow through a cooling fan.

With reference first to the front perspective view of FIG. 1A and to the back perspective view of FIG. 1B, electronics equipment sled 100 (or, e.g., "equipment shelf") comprises a plurality of I/O (input/output) electronics devices 101 (or collectively, e.g., an "I/O module") housed in an I/O compartment 102 (or e.g., "I/O bay"), an adjacent fan compartment 104 (or, e.g., "fan bay") housing one or more cooling fans 112, and a plurality of electronic devices 105, such as data storage devices, housed in an equipment compartment 106 (or, e.g., "equipment bay"), all housed or mounted in a support structure 108 (or e.g., "system enclosure"). Note that the configuration of an equipment sled may vary from implementation to implementation, and the configuration depicted in these figures is one example. FIG. 1B shows a set of backflow preventers 200, where each backflow preventer 200 is adhered, according to an embodiment, or otherwise attached to a corresponding fan housing 112a (see, e.g., FIG. 3) of a cooling fan 112.

FIG. 1C illustrates mounting and support structure for the fan bay 104, illustrated as positioned in the back perspective view of FIG. 1B (i.e., viewing from back to front). The fan bay support structure comprises a fan bay bracket 114 including a bottom face 114c, a top back flange 114a (for perspective, shown extending out from the plane of the page) and a top front flange 114b (for perspective, shown extending into the plane of the page), configured for housing a plurality of cooling fans such as cooling fan 112 (not visible here) each of which, according to an embodiment, has a corresponding backflow preventer 200 attached thereto. Note that the configuration of the fan bay support structure may vary from implementation to implementation, and the configuration depicted here is one example presented for installation context for the backflow preventers 200 in a sled such as electronics equipment sled 100. In such an installation as depicted in FIGS. 1A-1C, the flaps/louvers of backflow preventer 200 (see, e.g., backflow flaps 204a-204n of FIG. 2) would open outward from the plane of the page when in a normal state (FIG. 2), i.e., in the direction of the equipment bay 102.

Adhesive Layered Backflow Preventer

Figure 2:
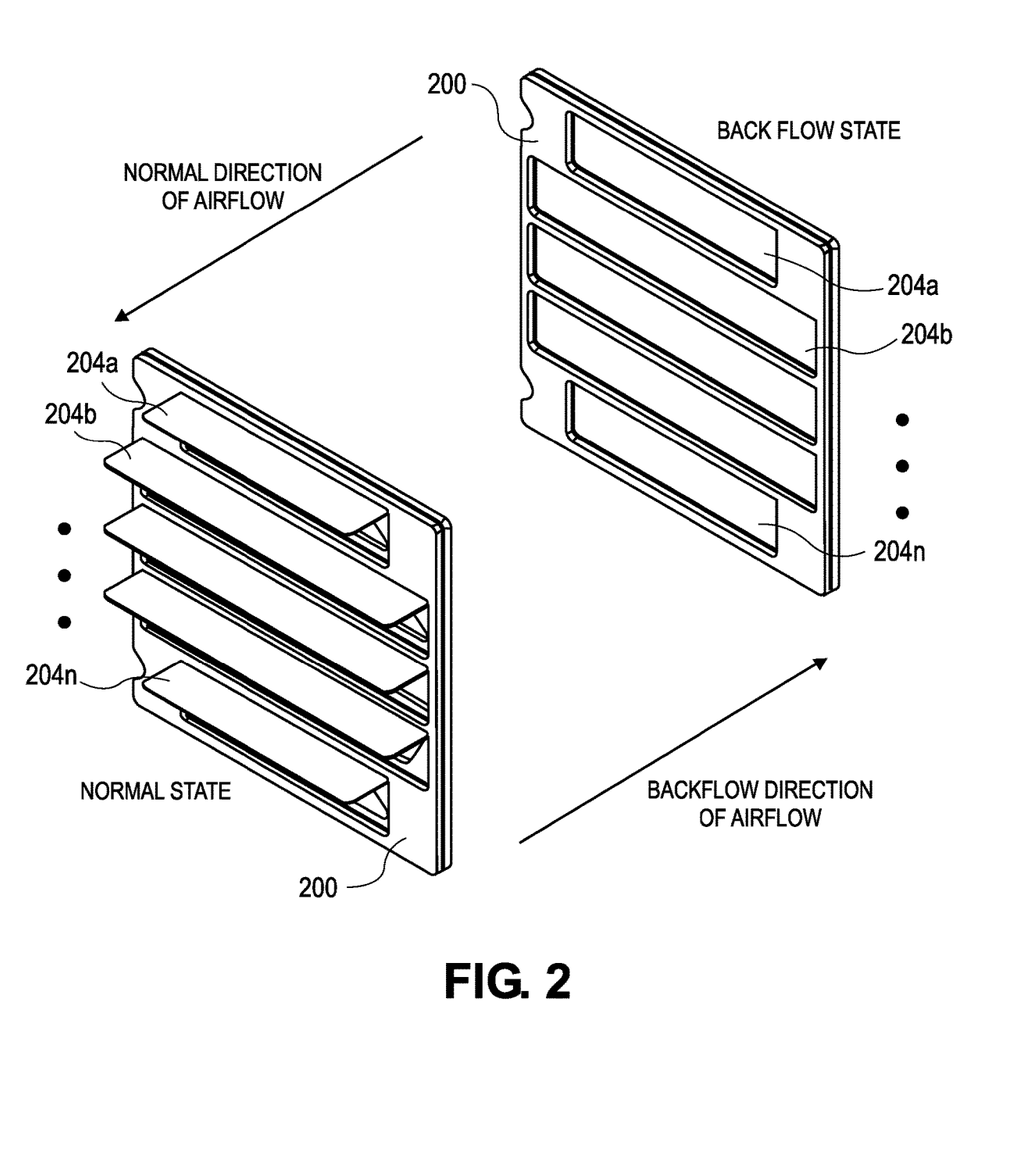
FIG. 2 is a perspective view illustrating a backflow preventer in a normal state and in a backflow state, according to an embodiment.

FIG. 2 is a perspective view illustrating a backflow preventer in a normal state and in a backflow state, according to an embodiment. According to an embodiment, adhesive layered backflow preventer 200 (or simply "backflow preventer 200") is a laminate structure configured to prevent or inhibit backflow air currents within a system enclosure, such as an equipment rack in which a sled such as electronics equipment sled 100 (FIGS. 1A-1B) may be installed. The layered or laminate structure and composition of the backflow preventer 200 is described in more detail in reference to FIG. 3, whereas a method of manufacturing such a backflow preventer is described in reference to FIG. 5.

Backflow preventer 200 comprises a plurality of hinged, one-direction rotatable backflow flaps 204a, 204b-204n (collectively, 204a-204n), where n represents an arbitrary number of flaps that may vary from implementation to implementation. With a desired and normal direction of airflow (as depicted by the annotated arrow), i.e., equipment cooling air from one or more cooling fans such as a cooling fan 112 of FIGS. 1A-1B, 3, each backflow flap 204a-204n rotates outward in the normal direction of and generally responsive to the desired cooling airflow. In the context of the electronics equipment sled 100 (FIGS. 1A-1B), the backflow preventer 200 allows for normal and desired cooling airflow to be drawn from the equipment bay 106 (e.g., the primary target of the cooling) and out the back of the fan bay 104. With a backflow direction of airflow (as depicted by the annotated arrow) each backflow flap 204a-204n hangs statically and functionally to prevent or inhibit or impede the backflow airflow from flowing in the backflow direction through the backflow preventer 200 and a corresponding cooling fan 112. In the context of the electronics equipment sled 100 (FIGS. 1A-1B), the backflow preventer 200 would inhibit backflow back into the equipment bay 106.

Figure 3:
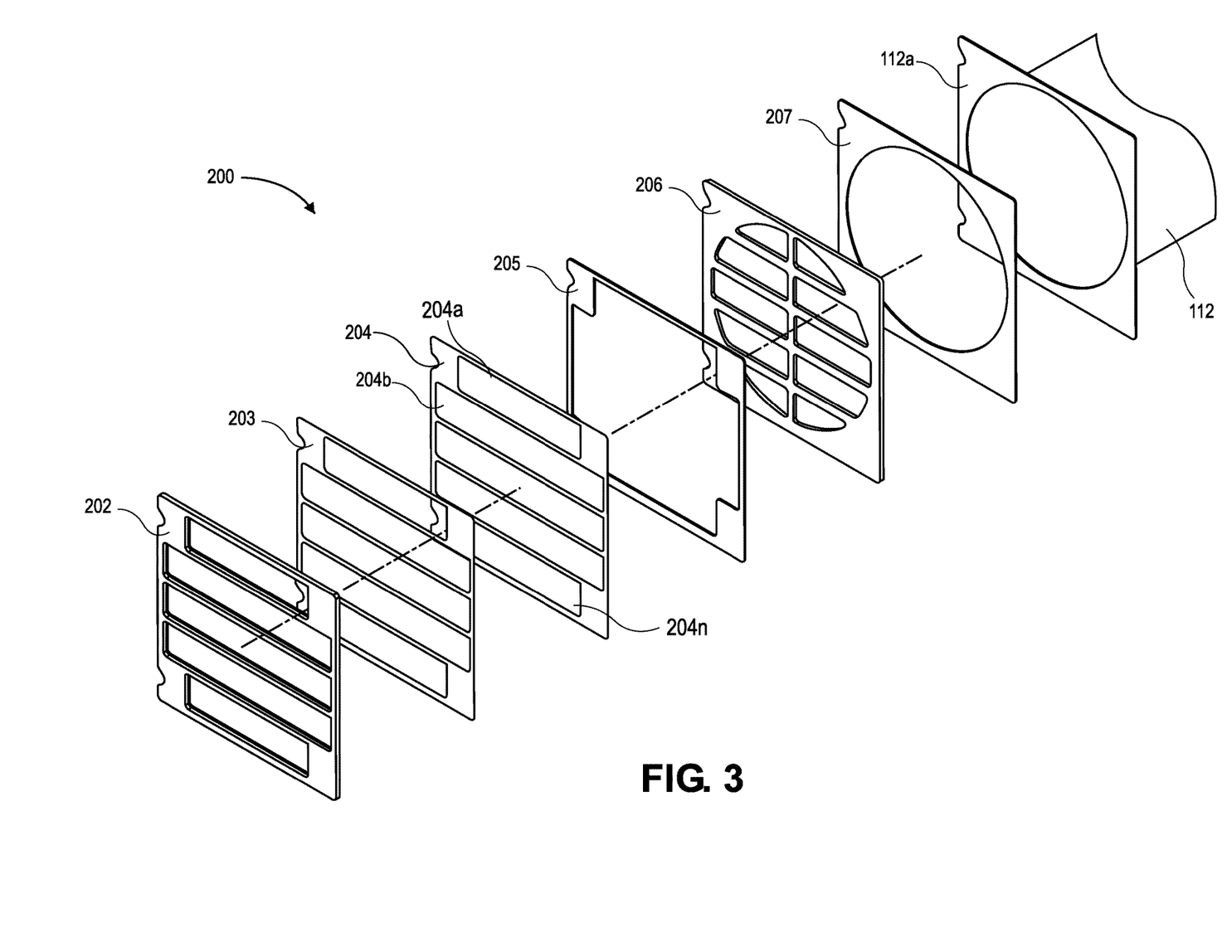
FIG. 3 is an exploded perspective view illustrating an adhesive layered backflow preventer, according to an embodiment.

FIG. 3 is an exploded perspective view illustrating a rectangular adhesive layered backflow preventer, according to an embodiment. Layered backflow preventer 200 comprises an assembly of layers (e.g., a laminate, as in a product made by laminating) of support and operational structures coupled or adhered together with interposed or generally alternating adhesive layers.

For example and according to an embodiment, the backflow preventer 200 comprises a front support layer 202 that has a proximal side (for perspective, the "front" side facing toward the left of the page) and a distal side (the "back" side opposing the proximal side, i.e., the side facing toward the right of the page), a first adhesive layer 203 adhered to the distal side of the front support layer 202, and a backflow flap layer 204 adhered to a distal side of the first adhesive layer 203. According to an embodiment, the front support layer 202 is composed of plastic, such as a polycarbonate resin thermoplastic, whereas the first adhesive layer 203 is composed of a polyethylene (e.g., polyester) film having an acrylic adhesive applied to both sides (e.g., similar to commercially available double-sided film tape).

According to an embodiment, the backflow flap layer 204 comprises one or more backflow flaps 204a, 204b-204n hinged to rotate in a proximal direction in a normal state (see, e.g., FIG. 2). As such, the front support layer 202 and the first adhesive layer 203 are each shaped with a substantially same or similar profile to each other, whereby each includes respective through-holes configured (e.g., shaped and positioned) to permit proximal rotation of the backflow flaps 204a-204n of the backflow flap layer 204, when in the normal state, through the through-holes of the front support layer 202 and the first adhesive layer 203, when assembled together. According to the described function of the backflow preventer 200, the backflow flaps 204a-204n of the backflow flap layer 204 are structurally hinged to rotate in only the single proximal direction when in the normal state, i.e., responsive to the cooling airflow from a corresponding fan 112, while being supported at least in part by the front support layer 202. Thus, the backflow flaps 204a-204n are constrained from rotating in the distal, backflow direction. A hinge such as with the backflow flaps 204a-204n is often referred to as a "living hinge", e.g., a thin flexible hinge made from the same material as the two rigid pieces it connects. According to an embodiment, the backflow flap layer 204 is itself composed of a layered or laminate structure such as, from front (proximal) to back (distal), a polyethylene film followed by an acrylic adhesive layer followed by a plastic (e.g., polycarbonate) base material, collectively on the order of 0.3 millimeters thick, for a non-limiting example. As such, functionally the front polyethylene film acting as a hinge point for the individual backflow flaps 204a-204n.

Continuing, the layered backflow preventer 200 further comprises a second adhesive layer 205 adhered to the distal side of the backflow flap layer 204 and a rear support layer 206 adhered to the distal side of the second adhesive layer 205, whereby the backflow flap layer 204 is supported at least in part by the rear support layer 206. According to an embodiment, the rear support layer 206 comprises airflow through-holes separated by crossbars, for example in a grate-like configuration as depicted in FIG. 3, to permit airflow through the through-holes of the rear support layer 206 while also limiting or preventing the backflow flaps 204a-204n of the backflow flap layer 204 from rotating in the distal, backflow direction. Still further, backflow preventer 200 further comprises a third adhesive layer 207 adhered to a distal side of the rear support layer 206, whereby the various layers of the layered backflow preventer 200 are collectively on the order of 2.0 millimeters thick, for a non-limiting example. According to an embodiment, the rear support layer 206 is composed of plastic, such as a polycarbonate resin thermoplastic, whereas each of the second adhesive layer 205 and the third adhesive layer 207 is composed of a polyethylene (e.g., polyester) film having an acrylic adhesive applied to both sides.

According to an embodiment, a distal side of the third adhesive layer 207 may be further adhered to a proximal side of a fan housing 112a of a cooling fan 112 or fan assembly. Thus, what is described is an adhesive layered backflow preventer 200 that is manufactured, assembled, composed in such a way to be devoid of any relatively costly injection molded and/or machined plastic parts, and devoid of metal components such as springs and/or hinges, by way of assembling a series of relatively or substantially two-dimensional profiles (e.g., alternating plastic and adhesive layers) rather than a set of complex parts.

Alternative Adhesive Layered Backflow Preventer Configurations

Figure 4A:
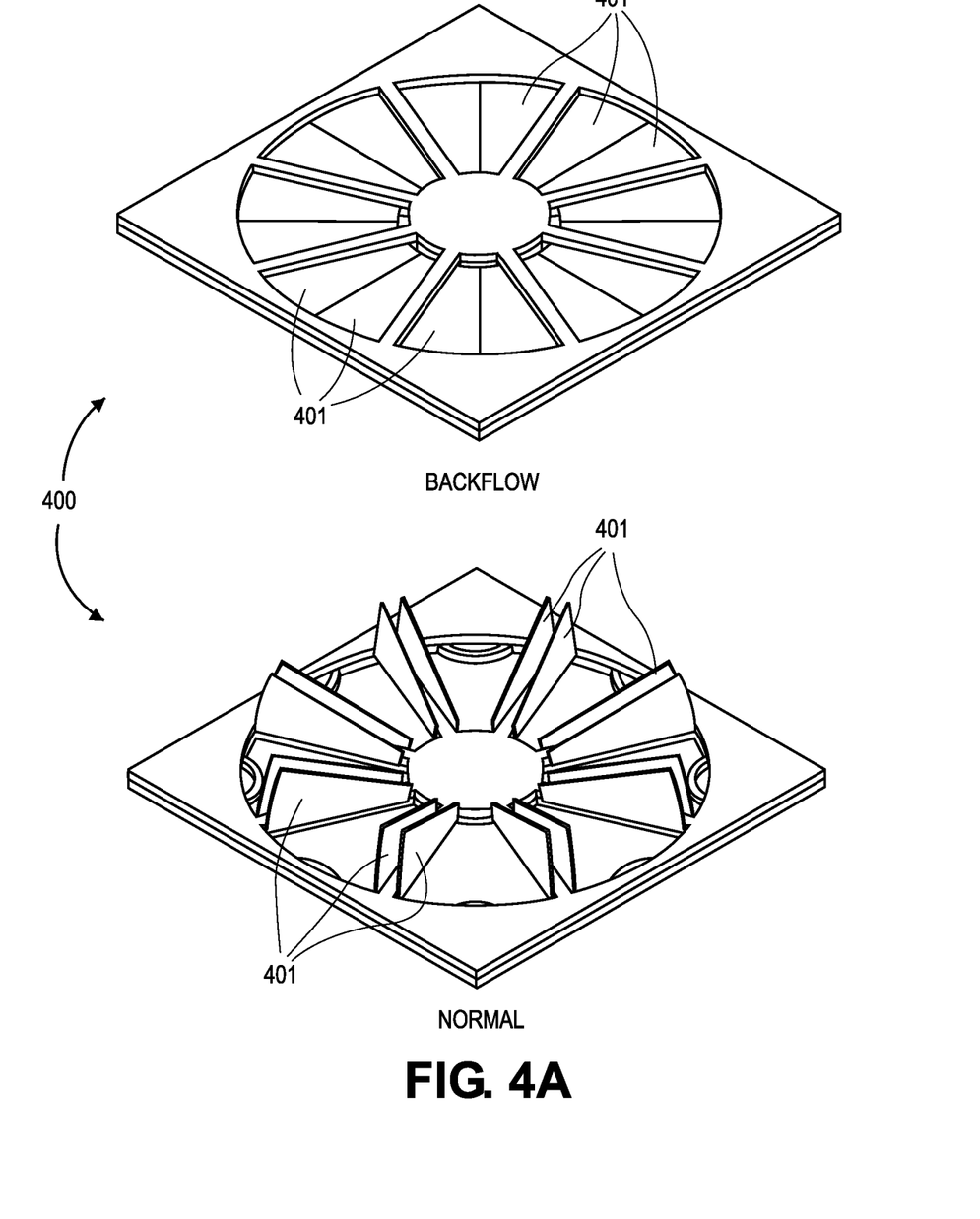
FIG. 4A is a perspective view illustrating an alternative configuration of an adhesive layered backflow preventer in backflow and normal states, according to an embodiment.

FIG. 4A is a perspective view illustrating an alternative configuration of an adhesive layered backflow preventer in backflow and normal states, according to an embodiment. Rather than comprising a set of parallel, hinged flaps such as the backflow flaps 204a-204n (e.g., depicted in a horizontal position as an example) of backflow preventer 200, an alternative adhesive layered backflow preventer 400 comprises a set of backflow flaps 401 that are positioned adjacently in pairs and circumferentially about a central support hub, and are configured for hingedly rotating in a circumferential direction in a normal state of airflow. Note that only some of the illustrated backflow flaps 401 are highlighted here with element numbers, for purposes of simplicity and clarity, while the backflow preventer 400 is actually depicted as having a total of eight pairs of backflow flaps 401, with each pair opening away from each other, in the normal state. However, the number of backflow flaps 401 in such a backflow preventer 400 configuration may vary from implementation to implementation, based on various design goals and airflow needs, for example. Regardless of the precise configuration desired and employed, an alternative backflow preventer configuration such as backflow preventer 400 may be assembled similarly to or the same as described in reference to the backflow preventer 200 of FIG. 3 and the method of manufacturing of FIG. 5.

Figure 4B:
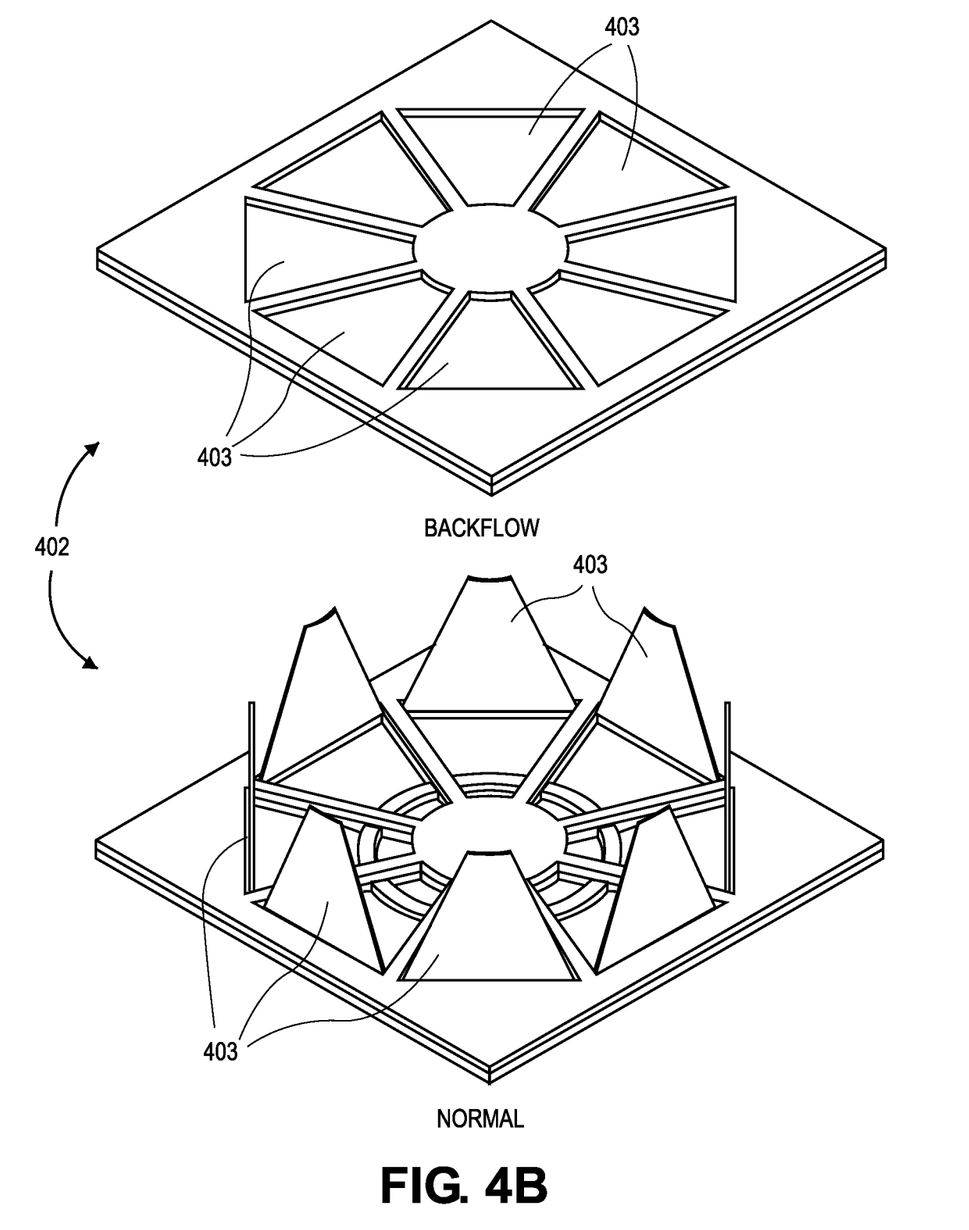
FIG. 4B is a perspective view illustrating another alternative configuration of an adhesive layered backflow preventer in backflow and normal states, according to an embodiment.

FIG. 4B is a perspective view illustrating another alternative configuration of an adhesive layered backflow preventer in backflow and normal states, according to an embodiment. Rather than comprising a set of parallel, hinged flaps such as the backflow flaps 204a-204n of backflow preventer 200, an alternative adhesive layered backflow preventer 402 comprises a set of backflow flaps 403 that are positioned adjacently and circumferentially about a central support hub, and are configured for hingedly rotating in a radial direction in a normal state of airflow. Note that only some of the illustrated backflow flaps 403 are highlighted here with element numbers, for purposes of simplicity and clarity, while the backflow preventer 402 is actually depicted as having a total of eight backflow flaps 403, with each opening away from the central hub, in the normal state. However, the number of backflow flaps 403 in such a backflow preventer 402 configuration may vary from implementation to implementation, based on various design goals and airflow needs, for example. Regardless of the precise configuration desired and employed, an alternative backflow preventer configuration such as backflow preventer 402 may be assembled similarly to or the same as described in reference to the backflow preventer 200 of FIG. 3 and the method of manufacturing of FIG. 5.

Method of Manufacturing Backflow Preventer Laminate Assembly

Figure 5:
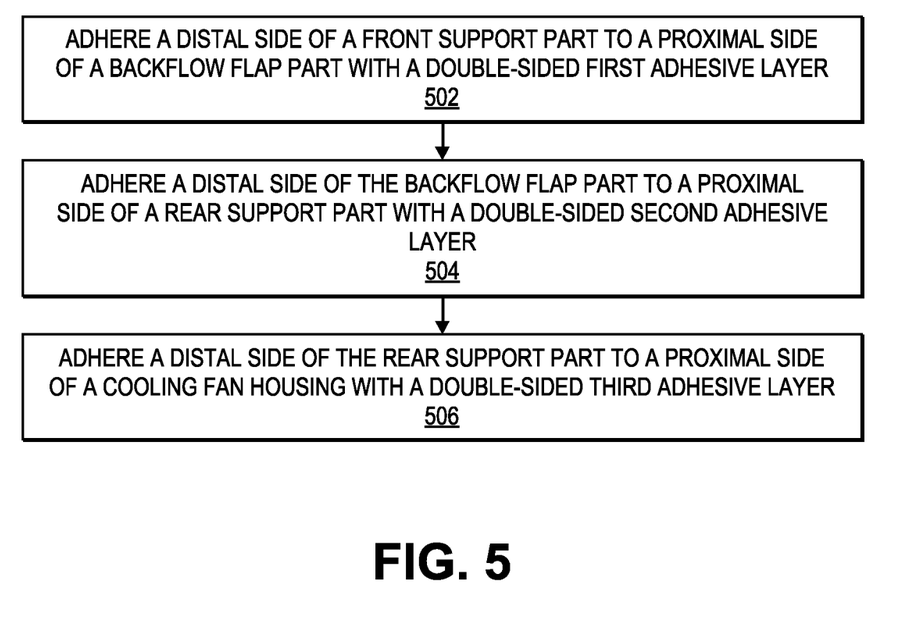
FIG. 5 is a flow diagram illustrating a method of manufacturing a backflow preventer laminate assembly, according to an embodiment.

FIG. 5 is a flow diagram illustrating a method of manufacturing a backflow preventer laminate assembly, according to an embodiment. The method of FIG. 5 may be used to manufacture any and all of the various backflow preventers illustrated and described herein, and equivalents and variants thereof.

At block 502, a distal side of a front support part is adhered to a proximal side of a backflow flap part, with a double-sided first adhesive layer. For example, the distal side of the front support layer 202 (FIG. 3) is adhered to a proximal side of the backflow flap layer 204 (FIG. 3) with the first adhesive layer 203 (FIG. 3). According to an embodiment, adhering with the first adhesive layer 203 may include aligning one or more through-holes of the front support layer 202 with corresponding one or more through-holes of the first adhesive layer 203 and corresponding backflow flaps 204a-204n of the backflow flap layer 204, to permit rotation of the aligned backflow flaps 204a-204n through the aligned through-holes of the front support layer 202 and the first adhesive layer 203.

At block 504, a distal side of the backflow flap part is adhered to a proximal side of a rear support part, with a double-sided second adhesive layer. For example, the distal side of the backflow flap layer 204 is adhered to a proximal side of the rear support layer 206 (FIG. 3) with the second adhesive layer 205 (FIG. 3).

At optional block 506, according to an embodiment, a distal side of the rear support part is adhered to the proximal side of a cooling fan housing with a double-sided third adhesive layer. For example, the distal side of the rear support layer 206 is adhered to a proximal side of the fan housing 112a of the fan 112 (FIG. 3) with the third adhesive layer 207 (FIG. 3). According to an embodiment, adhering with the third adhesive layer includes aligning airflow through-holes of the rear support layer 206 with one or more through-holes of the third adhesive layer 207 to allow airflow through the through-holes of the rear support layer 206.

Unless specifically stated, embodiments are not necessarily limited to the particular order of the blocks of FIG. 5. For example, an adhesive layered backflow preventer (such as backflow preventer 200 (FIG. 3), 400 (FIG. 4), 402 (FIG. 4B)) may be assembled in a reverse order to that described in reference to FIG. 5, whereby the fan housing 112a is first adhered to the rear support layer 206 using the third adhesive layer 207, then that sub-assembly is adhered to the backflow flap layer 204 using the second adhesive layer 205, and then that sub-assembly is adhered to the front support layer 202 using the first adhesive layer 203.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A layered backflow preventer assembly comprising:
   a front support layer having a proximal side and a distal side;
   a first adhesive layer adhered to the distal side of the front support layer;
   a backflow flap layer adhered to a distal side of the first adhesive layer and comprising one or more backflow flaps hinged to rotate in a proximal direction in a normal state;
   a second adhesive layer adhered to a distal side of the backflow flap layer;
   a rear support layer adhered to a distal side of the second adhesive layer; and
   a third adhesive layer adhered to a distal side of the rear support layer;
   wherein the front support layer and the first adhesive layer are shaped with a substantially same profile, each including one or more through-holes configured to permit proximal rotation of the backflow flaps through the through-holes of the front support layer and the first adhesive layer.

2. The backflow preventer assembly of claim 1, wherein the one or more backflow flaps are hinged to rotate in only the proximal direction in a normal state.

3. The backflow preventer assembly of claim 1, wherein the one or more backflow flaps are constrained from rotating in a distal direction.

4. The backflow preventer assembly of claim 1, wherein the rear support layer comprises means for permitting airflow through the rear support layer while constraining rotation in a distal direction of the one or more backflow flaps.

5. The backflow preventer assembly of claim 1, wherein the backflow preventer assembly is devoid of injection molded parts and machined plastic parts.

6. The backflow preventer assembly of claim 1, wherein the backflow preventer assembly is devoid of metal parts.

7. The backflow preventer assembly of claim 1, wherein the one or more backflow flaps are positioned adjacently in pairs and circumferentially about a central support hub and are configured for hingedly rotating in a circumferential direction in a normal state of airflow.

8. The backflow preventer assembly of claim 1, wherein the one or more backflow flaps are positioned adjacently and circumferentially about a central support hub, and are configured for hingedly rotating in a radial direction in a normal state of airflow.

9. A data storage system comprising:
   a system enclosure; and
   a backflow preventer laminate enclosed within the system enclosure and configured to prevent backflow air currents within the system enclosure, the backflow preventer laminate comprising:
   a front support layer having a proximal side and a distal side,
   a first adhesive layer adhered to the distal side of the front support layer,
   a backflow flap layer adhered to a distal side of the first adhesive layer and comprising one or more backflow flaps hinged to rotate in a proximal direction in a normal state,
   a second adhesive layer adhered to a distal side of the backflow flap layer,
   a rear support layer adhered to a distal side of the second adhesive layer, and
   a third adhesive layer adhered to a distal side of the rear support layer;
   wherein the front support layer and the first adhesive layer are shaped with a substantially same profile, including one or more through-holes configured to permit proximal rotation of the backflow flaps through the through-holes of the front support layer and the first adhesive layer.

10. The data storage system of claim 9, further comprising:
    a cooling fan enclosed within the system enclosure and comprising a fan housing; and wherein a distal side of the third adhesive layer of the backflow preventer laminate is further adhered to a proximal side of the fan housing.

11. The data storage system of claim 9, further comprising:
a plurality of data storage devices enclosed within the system enclosure; and
a cooling fan enclosed within the system enclosure between the plurality of data storage devices and the backflow preventer laminate.

12. The data storage system of claim 9, further comprising:
a plurality of data storage devices enclosed within the system enclosure;
a plurality of cooling fans enclosed within the system enclosure, each cooling fan comprising a fan housing; and
a plurality of the backflow preventer laminates;
wherein a distal side of the third adhesive layer of each of the plurality of backflow preventer laminates is adhered to a proximal side of a corresponding fan housing of a corresponding cooling fan of the plurality of cooling fans.

13. The data storage system of claim 9, wherein the one or more backflow flaps of the backflow flap layer of the backflow preventer laminate are hinged to rotate in only the proximal direction in a normal state.

14. The data storage system of claim 9, wherein each of the backflow flaps is constrained from rotating in a distal direction.

15. The data storage system of claim 9, wherein the rear support layer of the backflow preventer laminate comprises a plurality of airflow through-holes separated by crossbars in a grate-like configuration to permit airflow through the through-holes of the rear support layer.

16. A method of manufacturing a backflow preventer laminate assembly, the method comprising:
adhering a distal side of a front support part to a proximal side of a backflow flap part with a double-sided first adhesive layer, wherein the backflow flap part comprises one or more backflow flaps hinged to rotate in a proximal direction in a normal state, and the front support part and the first adhesive layer are shaped with a substantially same profile including one or more through-holes configured to permit proximal rotation of the backflow flaps through the through-holes of the front support part and the first adhesive layer; and
adhering a distal side of the backflow flap part to a proximal side of a rear support part with a double-sided second adhesive layer.

17. The method of claim 16, further comprising:
adhering a distal side of the rear support part to a proximal side of a cooling fan housing with a double-sided third adhesive layer.

18. The method of claim 17, wherein adhering with the third adhesive layer includes aligning airflow through-holes of the rear support part with one or more through-holes of the third adhesive layer to allow airflow through the through-holes of the rear support part.

19. The method of claim 16, wherein adhering with the first adhesive layer includes aligning the one or more through-holes of the front support part, the corresponding one or more through-holes of the first adhesive layer, and the corresponding backflow flaps to permit rotation of the aligned backflow flaps through the aligned through-holes of the front support part and the first adhesive layer.

20. The method of claim 16, wherein the front support part, the backflow flap part, and the rear support part are composed of a plastic material.

* * * * *